United States Patent [19]
Suda et al.

[11] Patent Number: 5,114,235
[45] Date of Patent: May 19, 1992

[54] METHOD OF DETECTING POSITIONAL DEVIATION

[75] Inventors: Shigeyuki Suda, Yokohama; Naoto Abe, Isehara, both of Japan

[73] Assignee: Canon Kabushiki Kaisha, Tokyo, Japan

[21] Appl. No.: 553,315

[22] Filed: Jul. 17, 1990

[30] Foreign Application Priority Data

Jul. 18, 1989 [JP] Japan .................................. 1-186937

[51] Int. Cl.⁵ .............................................. G01B 11/27
[52] U.S. Cl. ................................. 356/401; 250/237 G
[58] Field of Search ............... 356/400, 401, 399, 356; 250/237 G, 548

[56] References Cited

U.S. PATENT DOCUMENTS

| | | | |
|---|---|---|---|
| 4,037,969 | 7/1977 | Feldman et al. | 356/401 |
| 4,327,805 | 4/1982 | Feldman et al. | 356/401 |
| 4,600,309 | 7/1986 | Fay | 356/401 |
| 4,614,433 | 9/1986 | Feldman et al. | 356/401 |
| 4,838,693 | 6/1989 | Uchida et al. | 356/356 |
| 4,948,983 | 8/1990 | Maruyama et al. | 356/401 |

*Primary Examiner*—Samuel A. Turner
*Attorney, Agent, or Firm*—Fitzpatrick, Cella, Harper & Scinto

[57] ABSTRACT

A method of detecting relative positional deviation of first and second substrates, wherein first and second marks with optical powers are formed on the first and second substrates. A radiation beam is projected to the first substrate and, as a result, the first and second marks produce a signal beam whose position of incidence upon a predetermined plane is changeable with the relative positional deviation of the first and second substrates. A sensor is disposed adjacent to the predetermined plane and receives the signal beam to produce an output signal corresponding to the position of incidence of the signal beam upon the sensor. Here, a reference mark is provided to produce, when irradiated with a radiation beam, a reference beam so that it advances along a light path substantially the same as the light path for the signal beam to the sensor when the first and second substrates are in a predetermined positional relation. The produced reference beam is received by the sensor, whereby a reference signal corresponding to the position of incidence of the reference beam upon the sensor is obtained. The relative position of the first and second substrates can be detected on the basis of the output signal and the reference signal.

38 Claims, 10 Drawing Sheets

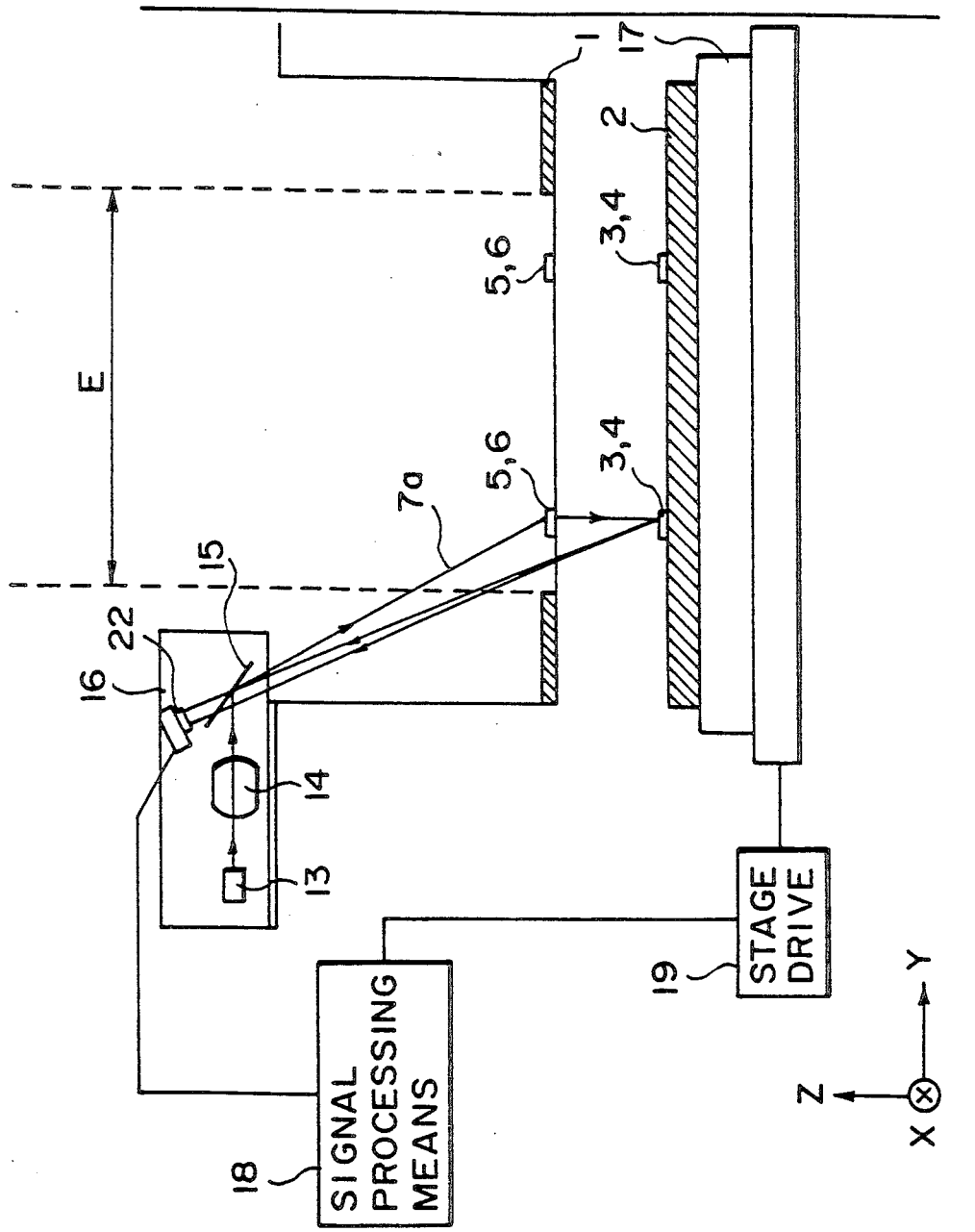
FIG. IA

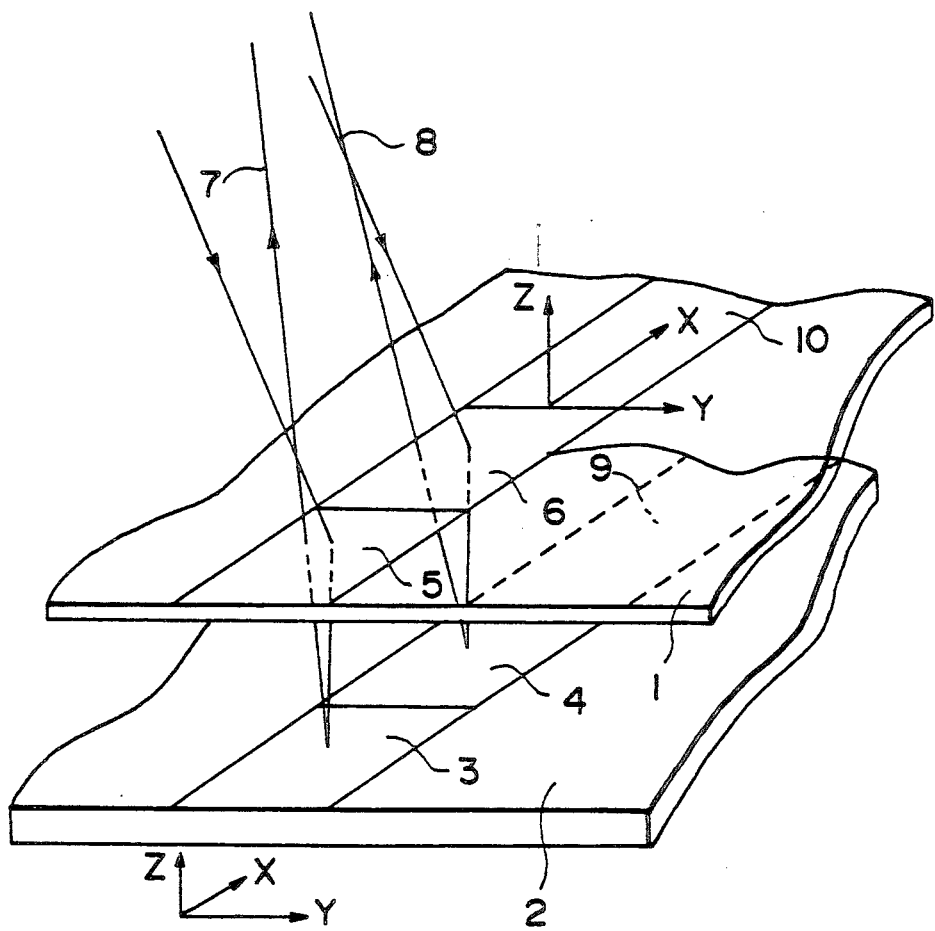
F I G. IC

METHOD OF DETECTING POSITIONAL DEVIATION

FIELD OF THE INVENTION AND RELATED ART

This invention relates to a method of detecting relative positional deviation of first and second substrates or objects. More particularly, the invention is concerned with a method, suitably usable in an exposure apparatus for manufacture of semiconductor microcircuit devices, for detecting relative positional deviation of a semiconductor wafer to a mask on which an integrated circuit pattern is formed.

A method of detecting positional deviation in such an exposure apparatus is disclosed in U.S. Pat. No. 4,037,969 or Japanese Laid-Open Patent Application, Laid-Open No. Sho 56-157033, wherein a mask and a wafer are formed with alignment marks such as Fresnel zone plates, having optical powers. Any relative positional deviation of the wafer to the mask can be detected by using these two marks.

SUMMARY OF THE INVENTION

It is an object of the present invention to provide an improved positional deviation detecting method for detecting, by use of such alignment marks with optical powers, relative positional deviation of a first substrate such as a mask and a second substrate such as a wafer.

In accordance with an aspect of the present invention, to achieve this object, there is provided a method of detecting relative positional deviation of first and second substrates, wherein first and second marks having optical powers are formed on the first substrate, wherein third and fourth marks having optical powers are formed on the second substrate, wherein a radiation beam is projected to the first substrate by an irradiating means, wherein as a result of the irradiation with the radiation beam the first and third marks produce a first beam whose position of incidence upon a predetermined plane is changeable in a first direction with the relative positional deviation of the first and second substrates, while the second and fourth marks produce a second beam whose position of incidence upon that plane is changeable in a second direction, different from the first direction, with the relative positional deviation of the first and second substrates, wherein a sensor disposed adjacent to the predetermined plane receives the first and second beams to produce an output signal corresponding to the spacing between the first and second beams upon the sensor, and wherein by using the output signal from the sensor the relative positional deviation of the first and second substrates is detected, the improvements residing in: providing a reference mark adapted to produce, when irradiated with a radiation beam, third and fourth beams so that the third and fourth beams advance along respective light paths which are substantially coincident with the light paths for the first and second beams advancing to the sensor when the first and second substrates are in a predetermined positional relationship; projecting, by use of the irradiating means, a radiation beam to the reference mark to thereby produce the third and fourth beams; receiving, by use of the sensor, the produced third and fourth beams and producing, by use of the sensor, a reference signal corresponding to the spacing of the third and fourth beams upon the sensor; and detecting the relative position of the first and second substrates on the basis of the output signal and the reference signal.

In accordance with another aspect of the present invention, there is provided a method of detecting relative positional deviation of first and second substrates, wherein first and second marks having optical powers are formed on the first and second substrates, respectively, wherein a radiation beam is projected to the first substrate by an irradiating means, wherein as a result of the irradiation with the radiation beam the first and second marks produce a signal beam whose position of incidence upon a predetermined plane is changeable with the relative positional deviation of the first and second substrates, wherein a sensor disposed adjacent to the predetermined plane receives the signal beam to produce an output signal corresponding to the position of incidence of the signal beam upon the sensor, and wherein by using the output signal from the sensor the relative positional deviation of the first and second substrates is detected, the improvements residing in: providing a reference mark adapted to produce, when irradiated with a radiation beam, a reference beam so that the reference beam advances along a light path which is substantially coincident with the light path for the signal beam advancing to the sensor when the first and second substrates are in a predetermined positional relationship; projecting, by use of the irradiating means, a radiation beam to the reference mark to thereby produce the reference beam; receiving, by use of the sensor, the produced reference beam and producing, by use of the sensor, a reference signal corresponding to the position of incidence of reference beam upon the sensor; and detecting the relative position of the first and second substrates on the basis of the output signal and the reference signal.

In the present invention, the reference mark may be provided on the first substrate or a stage member for supporting the first substrate. Alternatively, it may be provided on a separate, third substrate different from the first and second substrates. As a further alternative, it may be provided on the second substrate.

The reference beam such as the third or fourth beam may be a beam reflected by the reference mark or a beam transmitted through the reference mark.

The reference mark may be formed by a grating pattern and, by selecting the shape of such a grating pattern, the reference mark may be formed as a mark having an optical power, like a Fresnel zone plate, for example.

The irradiating means may irradiate the first substrate with light emitted by a gas laser, a semiconductor laser, a light emitting diode or the like. Preferably, the light from such a light source is transformed into parallel light which is then directed to the first substrate and the reference mark.

When the present invention is applied to an exposure apparatus for manufacture of semiconductor microcircuits, the first substrate may be a mask on which an integrated circuit pattern is formed and the second substrate may be a semiconductor wafer. Alternatively, the first substrate may be a semiconductor wafer and the second substrate a mask having an integrated circuit pattern.

Preferably, the reference mark comprises a first reference pattern operable to produce the third beam and a second reference pattern operable to produce the fourth beam, wherein the first and second reference patterns are different from each other and are set to correctly produce different beams, as the reference beam.

In accordance with one preferred form of the present invention, the first and second substrates are disposed opposed to each other with a predetermined spacing maintained therebetween and with their opposing surfaces maintained substantially parallel to each other. The irradiating means is disposed at a side of the first substrate remote from the second substrate. The reference mark is provided between the irradiating means and a stage member for carrying thereon the second substrate. A radiation beam is projected to the reference mark by the irradiating means, and the beam from the reference mark is reflected by a reflection mirror provided on the stage. The radiation beam reflected by the reflection mirror is inputted again to the reference mark by which a reference beam or beams, such as the third and fourth beams, are formed.

In this preferred form, the reference mark may be provided on the first substrate or on a third substrate, different from the first and second substrates. Preferably, the reference mark comprises a first reference pattern for deflecting a portion of the radiation beam to direct the same to the reflection surface, a second reference pattern for deflecting another portion of the radiation beam to direct the same to the reflection surface, a third reference pattern for deflecting the beam deflected by the first reference pattern and reflected by the reflection surface, and a fourth reference pattern for deflecting the beam deflected by the second reference pattern and reflected by the reflection surface.

In accordance with another preferred form of the present invention, alignment marks such as the first to fourth marks, for detection of the relative positional deviation, are set so that when the first and second substrates have no relative positional deviation the first and second beams are inputted to the sensor along inclined paths. The reference mark comprises a pattern adapted to produce reference beams such as the third and fourth beams advancing along respective paths which are substantially coincident with the paths for the beams, such as the first and second beams, advancing from the alignment marks to the sensor when the first and second substrates have no relative positional deviation. On the basis of a value represented by the reference signal and a value represented by the output signal, the relative positional deviation can be detected.

In addition to the positional detecting method based on a difference between the value represented by the reference signal and the value represented by the output signal, the present invention in an aspect thereof proposes a method of detecting positional deviation, wherein on the basis of the reference signal, a coefficient that represents the quantity of displacement or the quantity of change in the spacing, or the proportion of the position or spacing, upon the sensor, of the beams from the alignment marks, such as the first and second beams, is determined and wherein the relative positional deviation is detected on the basis of the thus determined coefficient and the output signal.

Further, in the present invention, the first to fourth marks may be set so that, when the first and second substrates have no relative positional deviation, the beams from the alignment marks, such as the first and second beams, are inputted to the light receiving surface of the sensor obliquely. Alternatively, these marks may be set so that, when the first and second substrates have no relative positional deviation, these beams are inputted perpendicularly to the light receiving surface of the sensor.

In the present invention, the sensor may detect the position of the center of gravity of a spot as formed on its light receiving surface by the reference beam or each of the beams from the alignment marks, such as the first and second beams, wherein a signal corresponding to the detected gravity center position is outputted. Alternatively, the sensor may be one adapted to detect a peak of an intensity distribution of a spot as formed on its light receiving surface by the reference beam or each of the beams from the alignment marks, wherein a signal corresponding to the detected peak is outputted. As an example, the sensor may comprise a CCD array or a position sensor.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1C illustrate a positional detecting system for use in an exposure apparatus, according to a first embodiment of the present invention, wherein FIG. 1A is a schematic view of the structure, FIG. 1B is a perspective view thereof and FIG. 1C illustrates a portion around a mask and a wafer.

DESCRIPTION OF THE PREFERRED EMBODIMENTS

Figure 1B:
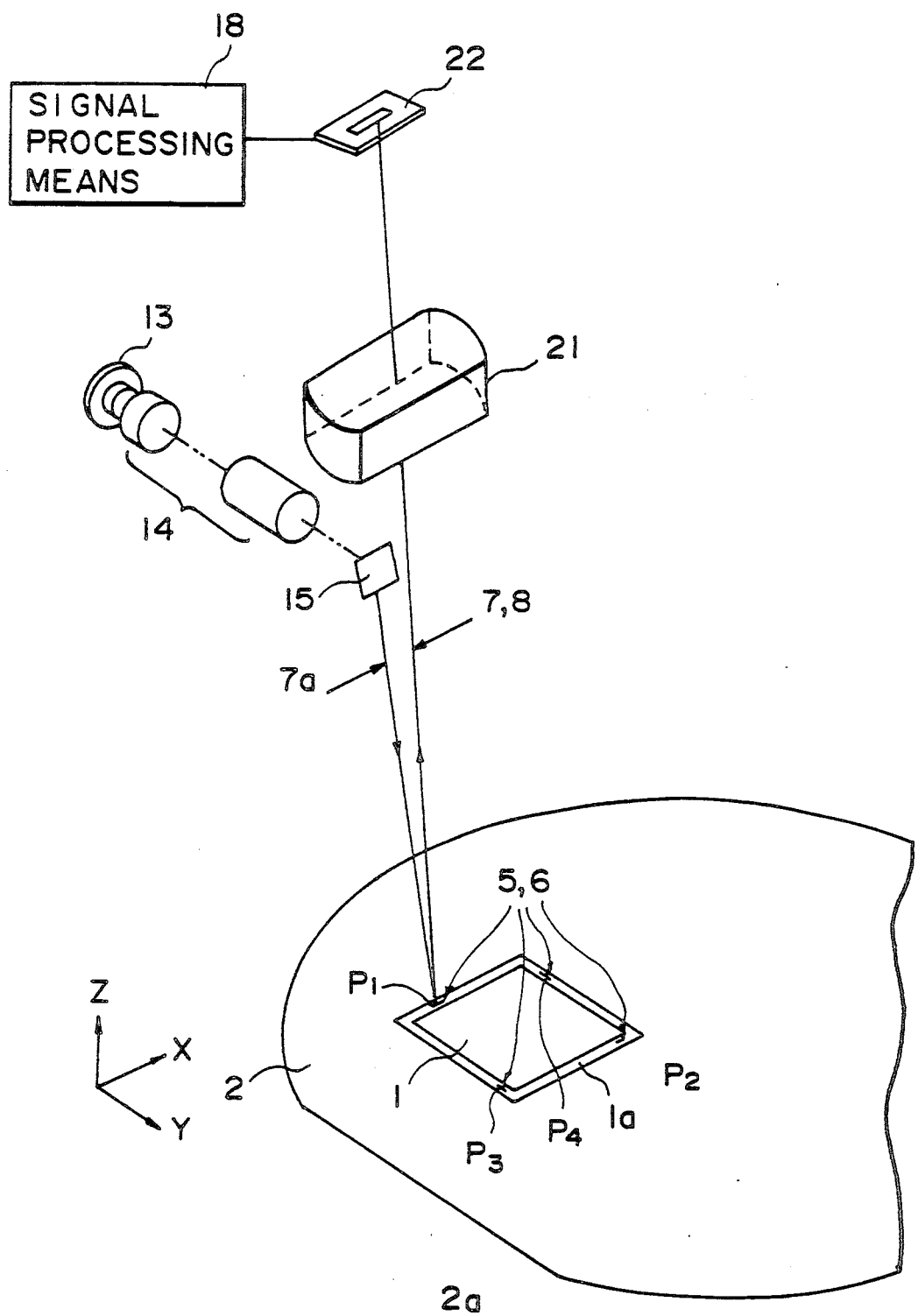

FIG. 1A is a schematic view showing the general structure of a position detecting system according to a first embodiment of the present invention, which is used in a semiconductor exposure apparatus. FIG. 1B is a schematic and perspective view of the position detecting system and FIG. 1C is a representation illustrating a portion around a mask and a wafer. In these drawings, denoted at 1 is a mask (first object) on which an integrated circuit pattern is formed; at 2 is a semiconductor wafer (second object); and at 5 and 3 are alignment marks operable to produce a first signal light, wherein the mark 5 is provided on the madk 1 and the mark 3 is provided on the semiconductor wafer 2. Similarly, denoted at 6 and 4 are alignment marks operable to produce a second signal light, wherein the mark 6 is provided on the mask and the mark 4 is provided on the wafer 2. Each of these alignment marks 3–6 is formed by a one- or two-dimensional grating pattern having a lens function. Reference numerals 7 and 8 denote the first and second signal lights for alignment. In this example, each of the alignment marks 3-6 is provided by one- or two-dimensional Fresnel zone plate which is a physical optic element, and is provided on a scribe line 10 or 9 on the mask 1 surface or the wafer 2 surface. Here, each of the marks 3 and 6 has a concave lens function, while each of the marks 4 and 5 has a convex lens function.

Denoted at 13 is a light source; at 14 is a collimator lens system; at 15 is a deflecting mirror; at 16 is a pickup housing; at 17 is a wafer stage; at 18 is a positional deviation signal processing means; at 19 is a wafer stage drive control means; and at E is the width of the region, in the y-axis direction, through which exposure light (X-rays) from an unshown illumination system passes. Denoted at 21 (FIG. 1B) is a light receiving lens; at 22 is a sensor which comprises a linear CCD sensor. The sensor 22 has its light receiving elements arrayed along, in FIG. 1A, the x-axis direction, that is, the direction with respect to which any positional deviation is to be detected. Light emanating from the light source 13 is collimated by the lens system 14 into light having a predetermined beam diameter and, through the deflection of the light path by the mirror 15, light 7a is provided.

Examples of the light source 13 usable in this embodiment are: a light source that emits coherent light, such as a semiconductor laser, a gas laser (e.g. a He-Ne laser, Ar laser); and a light source that emits incoherent light, such as a light emitting diode. In this particular example, a semiconductor laser is used.

As best seen in FIG. 1B, actually the mask 1 is provided with alignment marks (5, 6) at a position $P_1$ as well as positions $P_2$, $P_3$ and $P_4$. Also, the wafer 2 is provided with alignment marks (3, 4) at corresponding positions and, additionally, separate pickup housings and so on are provided (while not shown in the drawings) to observe these additional marks. For convenience in explanation, description will be made only with reference to the marks which are at the position $P_1$.

In this embodiment, the light 7a is projected to the alignment marks 5 and 6 on the mask 1 surface in an oblique direction, inclined at a predetermined angle with respect to the mask 1 surface. A portion of the inputted light is diffracted by and transmitted through the mark 5, and another portion of the light is diffracted by and transmitted through the mark 6. The obtained diffraction lights impinge on the alignment marks 3 and 4 on the wafer 2 surface, whereby reflectively diffracted lights 7 and 8 are produced which are then collected by the light receiving lens 21, respectively, and are received by the light receiving surface of the sensor 22. The sensor 22 serves to photoelectrically convert the lights 7 and 8, inputted to its light receiving surface, to produce electric signals. These signals from the sensor 22 are applied to the signal processing means 23. More sepcifically, the sensor 22 serves to detect the position of the center of gravity, upon its light receiving surface, of each of the lights 7 and 8 inputted to the sensor, and supplies to the signal processing means 23 the electric signals corresponding to the detected positions. By using the output signals from the sensor 22, the signal processing means 18 detects any relative positional deviation of the mask 1 and the wafer 2 with respect to the x direction. Then, the signal processing means 18 produces an instruction signal in accordance with the result of detection and applies the same to the drive control means 19 to cause the same to move the wafer stage 17 so as to align the wafer 2 with the mask 1.

Here, the term "center of gravity of the light" means such a point that, when in the cross-section of the light a position vector of each point in the section is multiplied by the light intensity of that point and the thus obtained products are integrated over the entire section, the integrated value has a "zero vector". In place of detecting such a gravity center position, the position of a peak of the light intensity distribution of each light 7 or 8 (light spot) may be detected.

Next, the principle of detection of positional deviation in the present embodiment will be explained.

Figure 2:
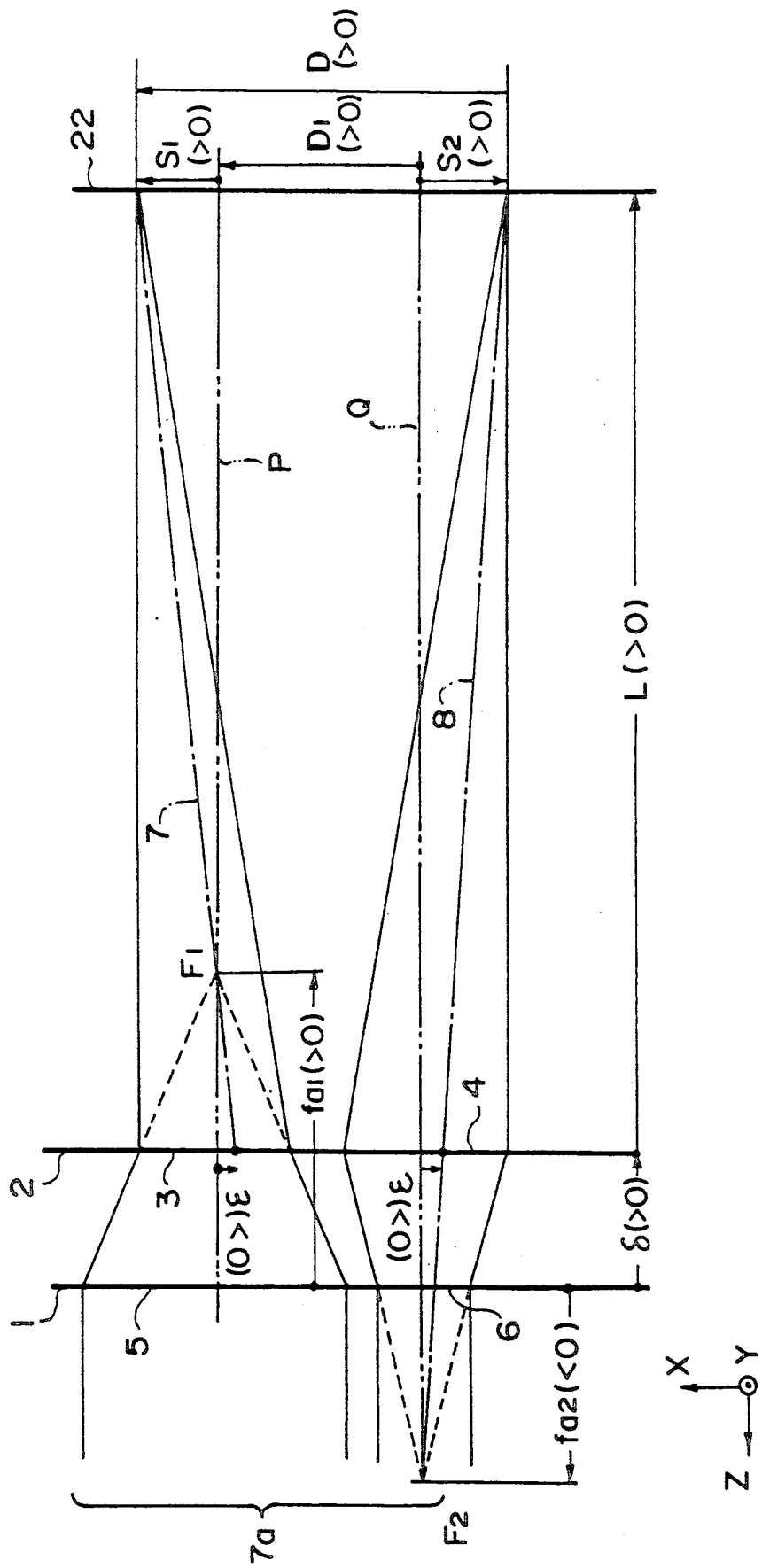
FIG. 2 is a schematic view of optical paths, for explaining the principle of positional deviation detection in the position detecting system of the first embodiment.

FIG. 2 is a schematic optical path view for explaining the principle of detection of positional deviation in the present embodiment. In this Figure, for convenience in explanation, the alignment marks 3 and 4 of reflection type are illustrated as transmission type lens elements (Fresnel zone plates) formed by grating patterns, respectively. Also, for convenience in explanation, it is assumed that the light receiving surface of the sensor 22 is spaced from the marks 3 and 4 of the wafer 2 by the same optical distance L. Also, it is assumed that the distance (gap) between the mask 1 and the wafer 2 is $\delta$; the focal lengths of the alignment marks 5 and 6 are $f_{a1}$ and $f_{a2}$, respectively; the relative positional deviation of the mask 1 and the wafer 2 with respect to the x direction is $\epsilon$; and displacements of the gravity centers of the first and second signal lights at that time, from the state as assumed at the correct alignment (the state as assumed when the mask 1 and the wafer 2 have no relative positional deviation) are $S_1$ and $S_2$, respectively. Further, for convenience, it is assumed that the light 7a impinging on the mask 1 has a plane wavefront, and signs are such as illustrated.

As seen in the drawing, in this example, the light 7 is such light influenced by the converging action of the alignment mark 5 having a convex lens function and influenced by the diverging action of the alignment mark 3 having a concave lens function and then collected on the light receiving surface of the sensor 22. On the other hand, the light 8 is such light influenced by the diverging action of the alignment mark 6 having a concave lens function and influenced by the converging action of the alignment mark 4 having a convex lens function and then collected on the light receiving surface of the sensor 22.

Assuming now that the x-axis positions of the optical axes of the alignment marks (5, 3, 6, 4) as the mask 1 and the wafer 2 have no relative positional deviation, are on the phantom lines P and Q in FIG. 2, the points of incidence of the lights 7 and 8 upon the light receiving surface of the sensor 22 with respect to the x direction, as the mask and the wafer have no relative positional deviation, are at the positions of intersection of the two phantom lines P and Q with the light receiving surface of the sensor 22. Here, if the wafer 2 is displaced relative to the mask 1 in the x direction by $\epsilon (\epsilon < 0)$, as seen in FIG. 2, the resultant state is similar to a state wherein one of the lenses of an ordinary optical system is displaced in a direction perpendicular to the optical axis of the optical system, namely, like a state in which the alignment of optical axes is destroyed. Thus, the angle of emission of each of the chief rays of the lights 7 and 8, emanating from the wafer 1, is changed. As a result, the position of incidence of each light upon the light receiving surface of the sensor 22, with respect to the x direction, deviates from the phantom line P or Q.

The displacements $S_1$ and $S_2$ of the gravity centers of the signal lights 7 and 8 each can be determined geometrically, as a point of intersection with the sensor 22 surface of a straight line connecting the focal point $F_1$ ($F_2$) of the alignment mark 5 (6) and the optical axis position of the alignment mark 3 (4). Accordingly, as seen from FIG. 2, the displacements $S_1$ and $S_2$ of the gravity centers of the signal lights 7 and 8 produced in response to a relative positional deviation of the mask 1 and the wafer 2, have opposite signs when the alignment marks 3 and 4 have opposite signs with regard to the optical imaging magnification. Also, quantitatively, the displacements $S_1$ and $S_2$ can be expressed as follows:

$$S_1 = -(L - f_{a1} + \delta)/(f_{a1} - \delta) \times \epsilon$$

$$S_2 = -(L - f_{a2} + \delta)/(f_{a2} - \delta) \times \epsilon \quad \text{(a)}$$

Thus, the deviation magnifications can be defined by:

$$\beta_1 = S_1/\epsilon$$

$$\beta_2 = S_2/\epsilon$$

This means that, if the deviation magnifications of opposite signs are set, a relative positional deviation of the mask 1 and the wafer 2 results in displacements of the lights 7 and 8 on the light receiving surface of the sensor 22, in opposite directions, more particularly, through $S_1$ and $S_2$.

In the upper part of FIG. 2, the alignment mark 5 transforms the received light into a convergent light and, before the light reaches the point $F_1$ of convergence, it irradiates the alignment mark 3. By this alignment mark 3, the light is imaged upon the light receiving surface of the sensor 22. Here, the alignment mark 3 has a focal length $f_{b1}$ which satisfies the following lens equation:

$$1/(f_{a1} - \delta) + 1/L = -1/f_{b1}$$

Similarly, in the lower part of FIG. 2, the alignment mark 6 transforms a received light into a divergent light, diverging from the point $F_2$ which is at the light input side of the mask 1. Then, the light is imaged by the alignment mark 4 upon the light receiving surface of the sensor 22. Here, the alignment mark 4 has a focal length $f_{b2}$ which is set to satisfy the following relation:

$$1/(f_{a2} - \delta) + 1/L = -1/f_{b2}$$

When the imaging magnification of the alignment mark 3 to a point image defined by the alignment mark 5 is determined to satisfy the above-described conditions, the displacement $S_1$ of the light spot formed on the light receiving surface of the sensor 22 by the light 7 is in an opposite direction to the direction of displacement of the wafer 2. Thus, the magnification $\beta_1$ as defined hereinbefore is negative. Similarly, when the imaging magnification of the alignment mark 4 to a point image (virtual image) defined by the alignment mark 6 is determined to satisfy the above-described conditions, the displacement $S_2$ of the light spot formed on the light receiving surface of the sensor 22 by the light 8 is in the same direction as the displacement of the wafer 2. Thus, the deviation magnification $\beta_2$ is positive. Accordingly, for a relative deviation $\epsilon$ of the mask 1 and the wafer 2, the system of alignment marks 5 and 3 and the system of alignment marks 6 and 4 produce signal light displacements $S_1$ and $S_2$ which are in opposite directions.

More specifically, considering a situation in which the mask 1 is spatially fixed and the wafer 2 is displaced downwardly as viewed in the drawing, the spacing between the gravity center positions of the light spots upon the light receiving surface of the sensor 22 is enlarged as compared with the spacing $D_1$ of the gravity center positions of the light spots as defined when the mask and the wafer are in correct alignment. If, on the other hand, the wafer 2 is displaced upwardly as viewed in the drawing, the gravity center positions are shifted to reduce the spacing D. Therefore, by detecting the spacing D of the gravity center positions of the lights 7 and 8, through the sensor 22, and by detecting the difference with respect to the value $D_1$ which is detected beforehand, it is possible to determine the deviation between the mask 1 and the wafer 2. Here, from equation (a), the spacing D and the deviation are in the following relation:

$$D - D_1 = -[(L - f_{a1} + \delta)/(f_{a1} - \delta) + (L - f_{a2} + \delta)/(f_{a2} - \delta)] \times \epsilon \quad \text{(b)}$$

By substituting D into equation (b), it is possible to calculate the deviation $\epsilon$.

A practical numerical example will now be explained.

The alignment marks 3—6 are provided by Fresnel zone plates (or grating lenses) having different focal lengths. A practically suitable size of each mark is 50–300 microns in the lengthwise direction (x direction) of the scribe line 9 or 10 and 20–100 microns in the widthwise direction (y direction) of the scribe line 9 or 10.

In the present embodiment, the light 7a is inputted to the mask 1 surface at an angle of incidence of about 17.5 degrees, with its projection component to the mask 1 surface being orthogonal to the scribe line directin (x direction).

The light 7a inputted obliquely to the mask 1 is influenced by the lens function of the alignment mark 5 (6) and is transformed into a convergent light (divergent light), which emanates from the mask 1 with its chief ray advancing at a predetermined angle with respect to a normal (z direction) to the mask 1 surface. While such angle can be set as desired, in this example the marks 5 and 6 are so formed that the chief ray is deflected toward the normal.

The transmissively diffracted lights 7 and 8 from the alignment marks 5 and 6 have a point of convergence and an origin of divergence, respectively, which are at predetermined positions vertically below and vertical above the wafer 2 surface, respectively. In this example, the alignment marks 5 and 6 have focal lengths of 214.723 microns and −156.57 microns, respectively. Also, the spacing between the mask 1 and the wafer 2 is 30 microns. The light 7 is transmissively diffracted by the alignment mark 5 and, while being influenced by the concave lens function of the alignment mark 3, it is reflectively diffracted by this alignment mark 3 of the wafer 2 and is collected on the light receiving surface of the sensor 22. Here, the light impinges on the sensor 22 with a displacement, of the position of incidence thereof upon the light receiving surface, corresponding to the relative positional deviation of the alignment marks 5 and 3 in the x direction and also with the displacement being of an amount corresponding to the magnified amount of the deviation. As a result, the displacement of the gravityy center position of the light 7 upon the light receiving surface of the sensor 22 can be detected by the sensor 22.

On the other hand, the light 8 is transmissively diffracted by the alignment mark 6 and, while being influenced by the convex lens function of the alignment mark 4 of the wafer 2, it is reflectively diffracted by this mark and is collected on the light receiving surface of the sensor 22 to form a light spot which is displaceable in a direction different from the direction of displacement of the light spot formed by the light 7. As regards the light 8, similarly to the light 7, the displacement of the position of incidence upon the light receiving surface of the sensor corresponds to the amount of misalignment between the axes of the alignment marks 6 and 4, with the quantity of misalignment being magnified upon the light receiving surface of the sensor. Also, the orientation of diffraction of each of the lights 7 and 8 is preferably on an order of 7-13 (deg) at the light input side.

Here, if the position of the light receiving surface of the sensor 22 on which the lights 7 and 8 are collected is disposed at a distance 18.657 mm from the wafer 2 or, alternatively, at a position equivalent to that distance with the intervention of the light receiving lens 21, then the absolute values of the respective rates of deviation magnification (i.e. the quotient obtainable by dividing "the quantity of change in the spacing between the gravity center positions of these lights upon the light receiving surface of the sensor 22" by "the relative positional deviation of the mask 1 and the wafer 2") each is equall to "×100" and they are in the opposite direction. Thus, when they are combined, a deviation magnification of "×200" is obtainable. On this occasion, if the mask 1 and the wafer 2 are relatively displaced by 0.005 micron in the x direction, the spacing between the gravity center positions of the two lights 7 and 8 on the light receiving surface of the sensor 22, namely, the spacing between the light spots formed by these lights, changes through 1 micron. By detecting the spacing of these light spots, the relative positional deviation of the mask 1 and the wafer 2 can be detected. Here, if each alignment mark as a lens has an effective diameter of about 200 microns and a semiconductor laser providing a wavelength λ of about 0.8 micron are used, the diameter of each light spot on the light receiving surface of the sensor 22 can be set to be approximately equal to 200 microns.

As an example, the spacing of the two light spots to be assumed in correct alignment may preferably be set to be equal to about 2.0 mm.

Here, in order to provide the alignment marks 5 and 6 with a spacing of 100 microns maintained between their centers, to define an interval L of 18.657 mm between the wafer 2 and the light receiving surface of the sensor 22 and to set an offset value corresponding to the spacing of the light spots in the state of correct alignment, at a precision of 0.01 micron, it is necessary to set the spacing L at a precision of about 19.6 micron, and this can be concluded from simple geometrical calculations. Also, in order to allow measurement of positional deviation of 3.0 microns between the mask 1 and the wafer 2 at a precision of 0.003 microns, the setting precision for the deviation magnification $\beta$ should be equal to 0.1% or less, and this means that the setting precision for the interval L has to be equal to about 18.5 microns or less. Generally, however, the light receiving portion of a sensor is mounted to a ceramics package and the package is then secured to a housing 16. This necessitates complicated operation for the positioning of the same with good precision.

In the present embodiment, in consideration thereof, the mask 1 is provided with reference marks 5' and 6' each comprising a physical optic element, and these reference marks 5' and 6' are irradiated with the light 7a from the pickup 16. These reference marks 5' and 6' are so structured that, only with these reference marks, namely, without intervention of the wafer 2, diffraction lights 7' and 8' are produced and projected to the light receiving surface of the sensor 22 in the pickup 16, wherein the diffraction lights 7' and 8' are the same as the diffraction lights (first and second signal lights) 7 and 8 as produced when the mask 1 and the wafer 2 are in correct alignment with each other, with respect to the angle of emission of the chief ray from the mask 1 and to the spacing of the lights as received by the sensor. More specifically, the reference marks 5' and 6' are so designed and formed on the mask 1 that the reference marks 5' and 60' emit those lights 7' and 8' having the same emission angles of the chief rays (from the mask 1) and having the same spacing between the chief rays, as the lights 7 and 8 to be directed from the mask to the points of intersection between (i) the lights 7 and 8 as produced when the mask and the wafer are in correct alignment with each other as illustrated in FIG. 1B and (ii) a predetermined plane as set by design values and on which the light receiving surface of the sensor 22 is to be positioned. In other words, the reference marks 5' and 6' are so designed and provided to produce the lights 7' and 8' which advance to the sensor 22 along the light paths which are substantially coincident with the paths of the lights 7 and 8 to be produced when the mask and the wafer are in correct alignment with each other.

Figure 3A:
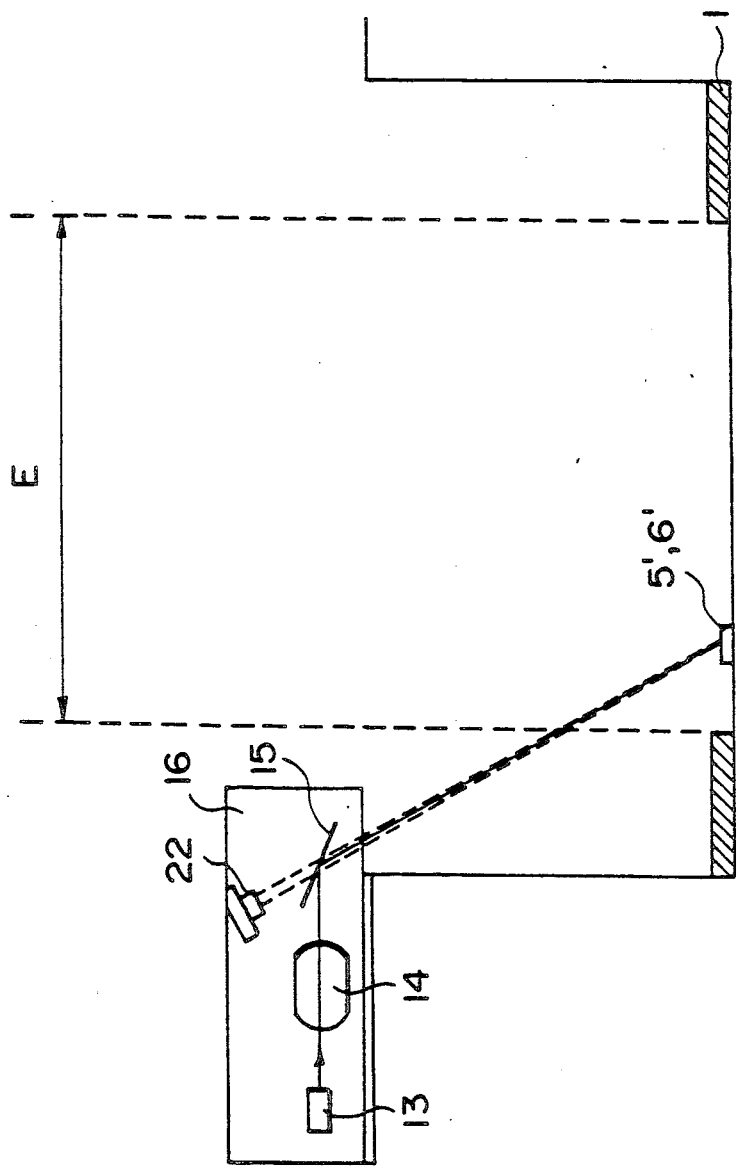
FIG. 3A is a schematic view showing the state of the position detecting system of the first embodiment, for the reference spacing setting or calibration.
Figure 3B:
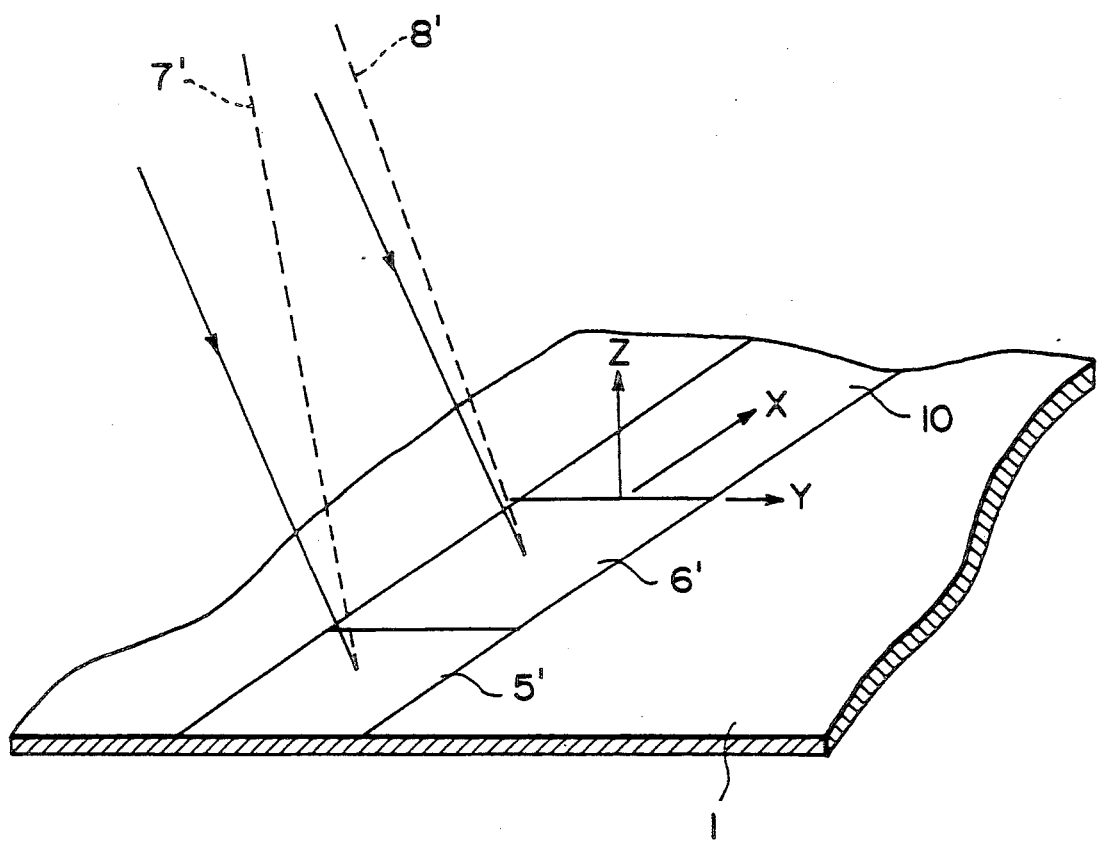
FIG. 3B is a schematic view showing a portion adjacent to reference marks.

FIG. 3A illustrates production of these diffraction lights 7' and 8' by the reference marks 5' and 6', and FIG. 3B illustrates a portion around the reference marks 5' and 6'. The spacing of these two light spots as formed by the lights 7' and 8' upon the light receiving surface of the sensor 22 is measured by the sensor 22 and the processing means 18, and the measured value is used as an absolute reference value and is memorized into a memory of the processing means 18 as the reference spacing value, i.e., $D_1$ as described hereinbefore. Alternatively, when a certain reference value such as the design value of the spacing $D_1$ has already been stored in the memory, the measured value obtained by the reference marks 5' and 6' may be compared with the stored reference value by the processing means 18 so as to calibrate the stored reference value.

Figure 3C:
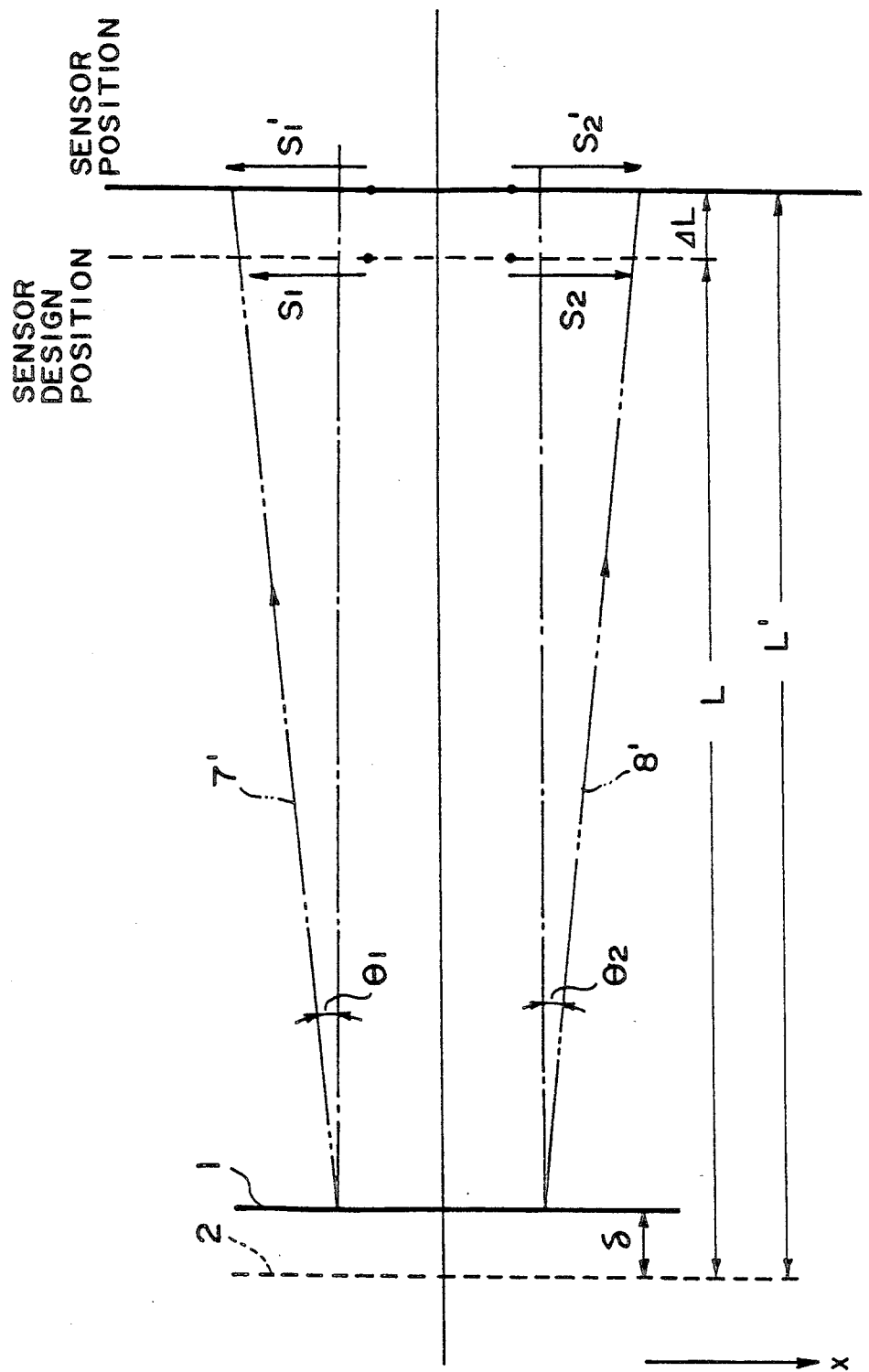
FIG. 3C is a schematic view, for explaining the principle of magnification setting or calibration in the position detecting system of the first embodiment.

By using the principle of such setting or calibration of the reference (spacing) value as described, the deviation magnification $\beta$ as explained hereinbefore can be set or calibrated, in the following manner:

As seen in FIG. 3C, it is assumed that $\theta_1$ and $\theta_2$ denote the angles of emission of the diffraction lights 7' and 8' from the reference marks 5' and 6' of the mask 1, with respect to the light receiving surface of the sensor 22. Also, the design reference (spacing) value corresponding to the spacing of the light spots on the sensor 22 as determined by calculation is denoted by $D_0$, and the spacing of the light spots as formed by the diffraction lights 7' and 8' from the reference marks 5' and 6', as described above, is denoted by D.

When $\Delta D = D - D_0$ is given, the setting error $\Delta L$ of the sensor 22 can be expressed by:

$$\Delta L = \Delta D / (\tan \theta_1 + \tan \theta_2)$$

It follows therefrom that $$L' = L + \Delta L$$

Thus, by applying L' to equation (b), it is possible to determine the deviation magnification β which corresponds to the coefficient for the deviation ε. These calculations for determining the deviation magnification are performed in the processing means 18, and the result thereof is memorized into the memory.

While in the foregoing, for convenience, explanation has been made of an example wherein no light receiving lens is interposed, if an optical system such as the light receiving lens 21 is interposed, it is still easy to detect the change in the spacing as represented by the signal from the sensor 22, to the positional deviation of the sensor 22, by geometrical calculations. Further, in this embodiment, for ease in explanation, the characteristics of the reference marks 5' and 6' have been described as those adapted to produce diffraction lights equivalent to the diffraction lights 7 and 8 to be produced in the state of correct alignment. However, the reference marks may be those adapted to produce diffraction lights equivalent to the diffraction lights 7 and 8 to be produced when the mask 1 and the wafer 2 have a particular relative positional deviation as predetermined. For example, by using two lights 7' and 8' whose chief rays have the same emission angles (from the plane including the mask 1) and the same spacing as of the two lights 7 and 8 to be produced when the mask 1 and the wafer 2 deviate by 5 microns, it is possible to set or calibrate the deviation magnification β and, based on this, it is possible to set the reference value $D_1$.

The pickup housing 16 is movable in the x and y directions, and it can be moved to a position so as to irradiate, with the light from the light source 13, the reference marks 5' and 6' which are formed at predetermined sites different from the sites of the alignment marks 5 and 6. Thus, for the setting or calibration of the reference value $D_1$ or the deviation magnification β, the pickup housing 16 is moved to the position for illuminating the reference marks 5' and 6'.

Figure 4A:
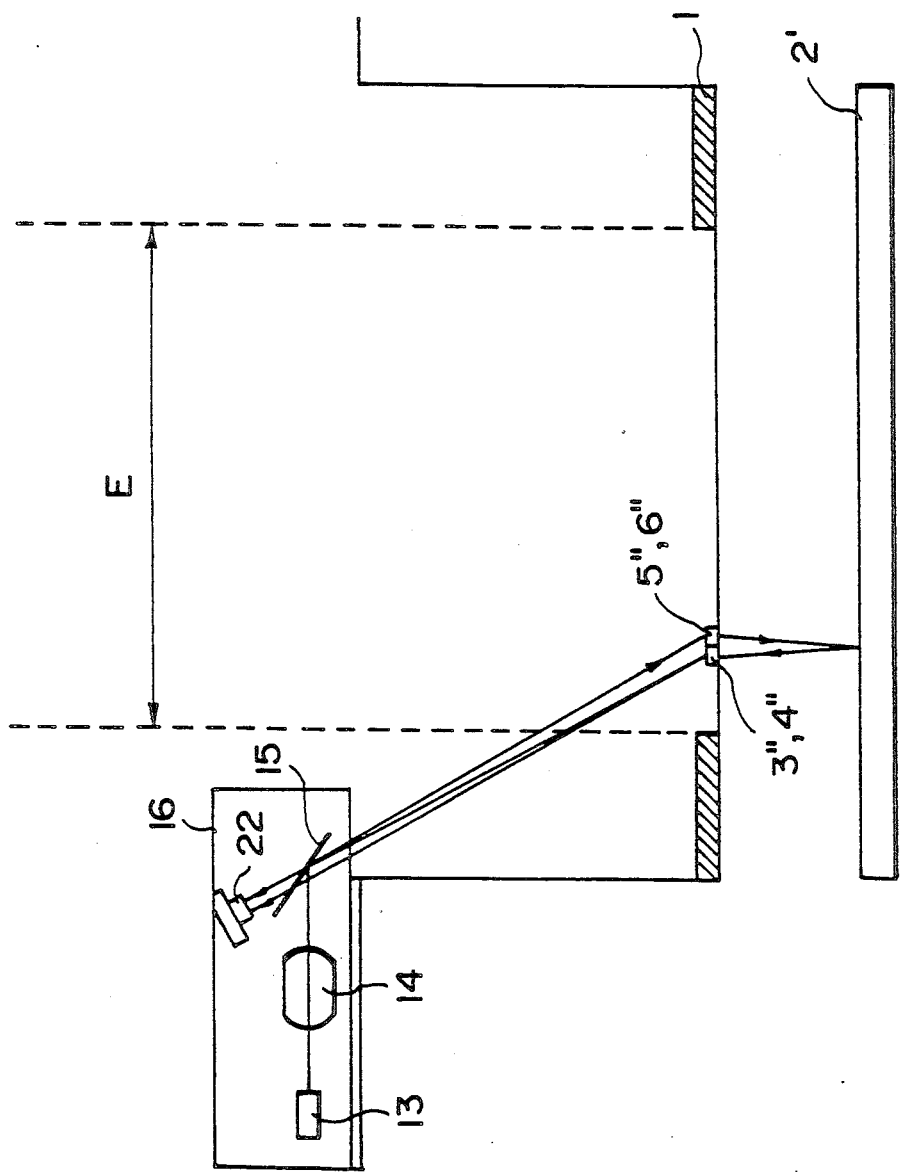
FIG. 4A is a schematic view of a position detecting system according to a second embodiment of the present invention.
Figure 4B:
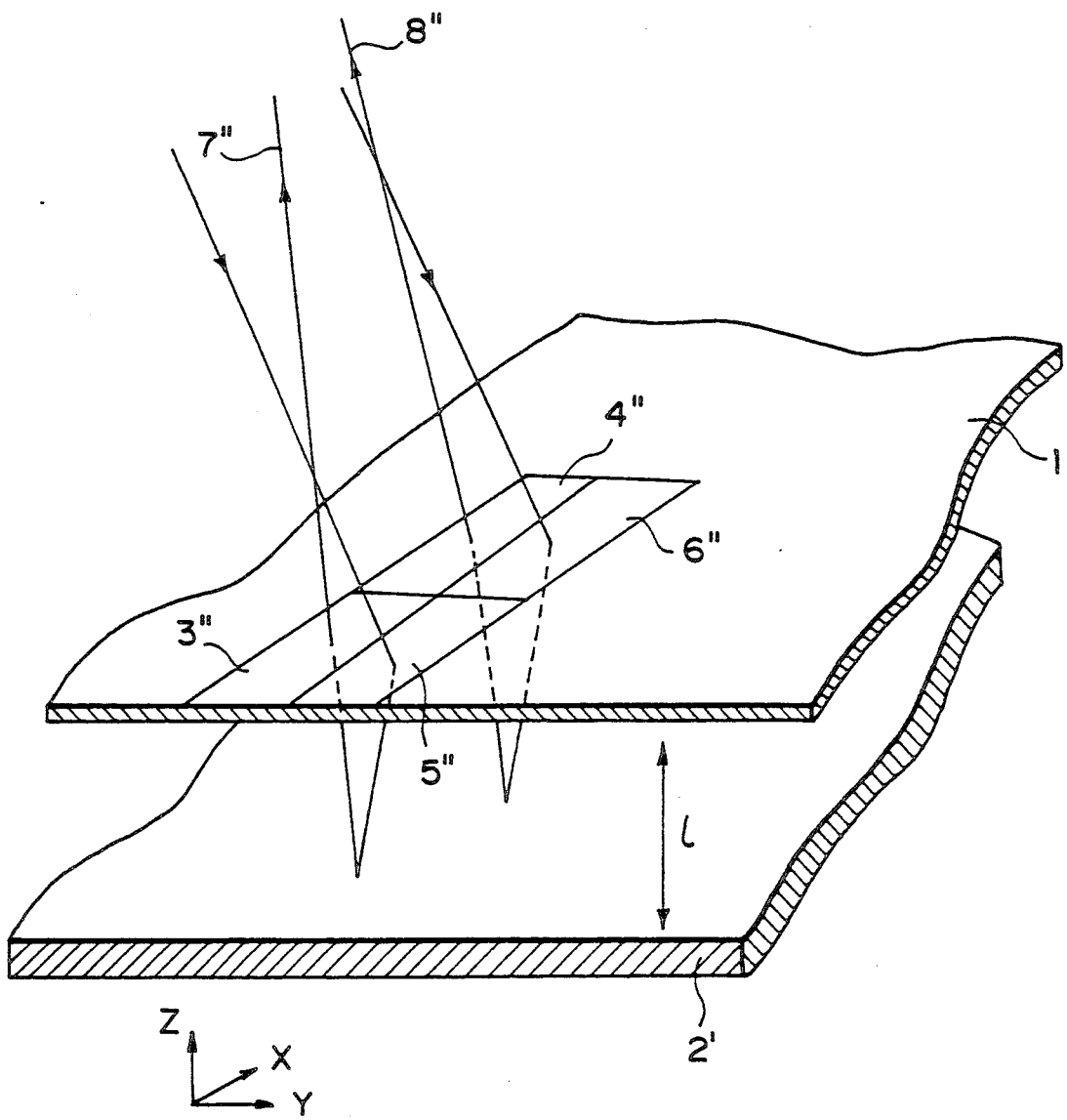
FIG. 4B is a schematic view, showing a portion around reference marks.

Referring now to FIGS. 4A and 4B, a second embodiment of the present invention will be explained.

FIG. 4A is a schematic view, showing a position detecting system according to the second embodiment, in a state in which reference marks are used. FIG. 4B is a schematic view, illustrating a portion around these reference marks. In the drawings, denoted as 3", 4", 5" and 6" are referenced marks; denoted at 7" and 8" are the lights having been deflected by the reference marks (50", 3") and the reference marks (4", 6"), respectively; and denoted at 2' is a reflection mirror provided on a wafer stage.

In this embodiment, the mask 1 is provided with four reference marks 3"-6" and, additionally, the reflection mirror 2' comprising a flat mirror without a pattern is disposed below the mask to be opposed thereto with an interval l. Light from a pickup 16 is projected to the reference marks 5" and 6", and the input light is transmissively diffracted by these reference marks 5" and 6" and then is regularly reflected by the reflection mirror 2'. The reflected light is then transmissively diffracted by the reference marks 3" and 4", whereby the thus obtained diffraction lights 7" and 8" are received by a light receiving surface of a sensor 22 in the pickup 16. The reference marks 3"-6" are designed so as to provide those characteristics which are adapted to produce the diffraction lights 7' and 8', emanating from the mask 1, whose chief rays have the same emission angles and the same spacing as of the chief rays of the signal lights 7 and 8 to be produced when the mask 1 and the wafer 2 are in correct alignment with each other.

Accordingly, as in the foregoing embodiment, by measuring the spacing of the two light spots upon the light receiving surface of the sensor 22 and by using the thus measured value, it is possible to set or calibrate the reference value $D_1$ and/or the deviation magnification β. The reference marks 3"-6" can be prepared by using an electron beam pattern drawing apparatus, like the preparation of a circuit pattern to be transferred to a resist on the wafer 2. Also, an alignment precision on an order of 0.01 micron can be ensured for the mask-to-wafer alignment. It is sufficient that the characteristics of the reference marks 3"-6" are such that satisfy, with respect to calibration of the reference value or the magnification for the detection of positional deviation, those conditions necessary for obtaining desired values, e.g., with regard to the size of each of the two light spots to be formed on the light receiving surface of the sensor 22 by the diffraction lights 7' and 8' as produced through these marks. The light emission side numerical aperture (NA) of the reference marks 3" and 4" may be selected to be substantially the same as that of the alignment marks 3 and 4 for the positional deviation detection. Also, the focal lengths of the reference marks 3"-6" may be set as desired. Further, in order to provide a large tolerance with respect to the design value of the interval l between the mask 1 and the reflection mirror 2', one of two sets of reference marks may be provided by a linear grating (having an infinite focal length) while the other set may be provided by a grating pattern having a focal length determined on the basis of the interval L between the wafer 2 and the sensor 22 and in consideration of the spacing l between the mask 1 and the reflection mirror 2". In other words, the reference mark 5" or 6" may be provided by a linear grating pattern, while the reference mark 3" or 4" may be provided by a Fresnel zone plate having a lens function. On that occasion, the focal length of each of the marks 3" and 4" may be set to be equal to "L −l". If, on the other hand, the marks 3" and 4" are provided by linear grating patterns and the marks 5" and 6" are provided by Fresnel zone plates having lens functions, the focal length of each of the marks 5" and 6" may be set to be equal to "L+l". As a matter of course, in any case, the marks 5" and 6" may preferably have those characteristics effective to deflect received lights in the same directions as the signal lights 7 and 8. Further, it will be readily understood that, as regards the focal lengths of the reference marks 3"-6", in a combination on an order of a few millimeters, those are satisfactory if they are within the precision for the setting of the reflection mirror 2'. Moreover, disposition of the reference marks 3"-6" is not limited to that as illustrated in FIG. 4B, and the marks 3" and 5" may be interchanged with the marks 4" and 6". Further, the two lights 7' and 8' may be such lights, as in the foregoing embodiment, whose chief rays have the same emission angles, from the mask, and the same spacing as of the two lights 7 and 8 to be produced when a particular positional deviation is present between the mask 1 and the wafer 2.

Use of a lower diffraction order with regard to the reference marks (5', 6') or the reference marks (3", 4", 5", 6") is desirable, in the point of advantage of reduced quantity of other unwanted diffraction light to be received by the sensor 22. However, if the light is inputted obliquely to the mask 1 at an angle of incidence of 17.5 degrees, in order to obtain as the reflectively diffracted light a first order reflection light which advances at an angle of 7 or 13 degrees to the light input side, a diffraction angle on an order of 30 degrees is necessary. This may cause a difficulty in manufacture since the linewidth of the pattern for the alignment mark or the reference mark has to be reduced. Therefore, if necessary, second order diffraction light or third order diffraction light may be used.

Figure 5:
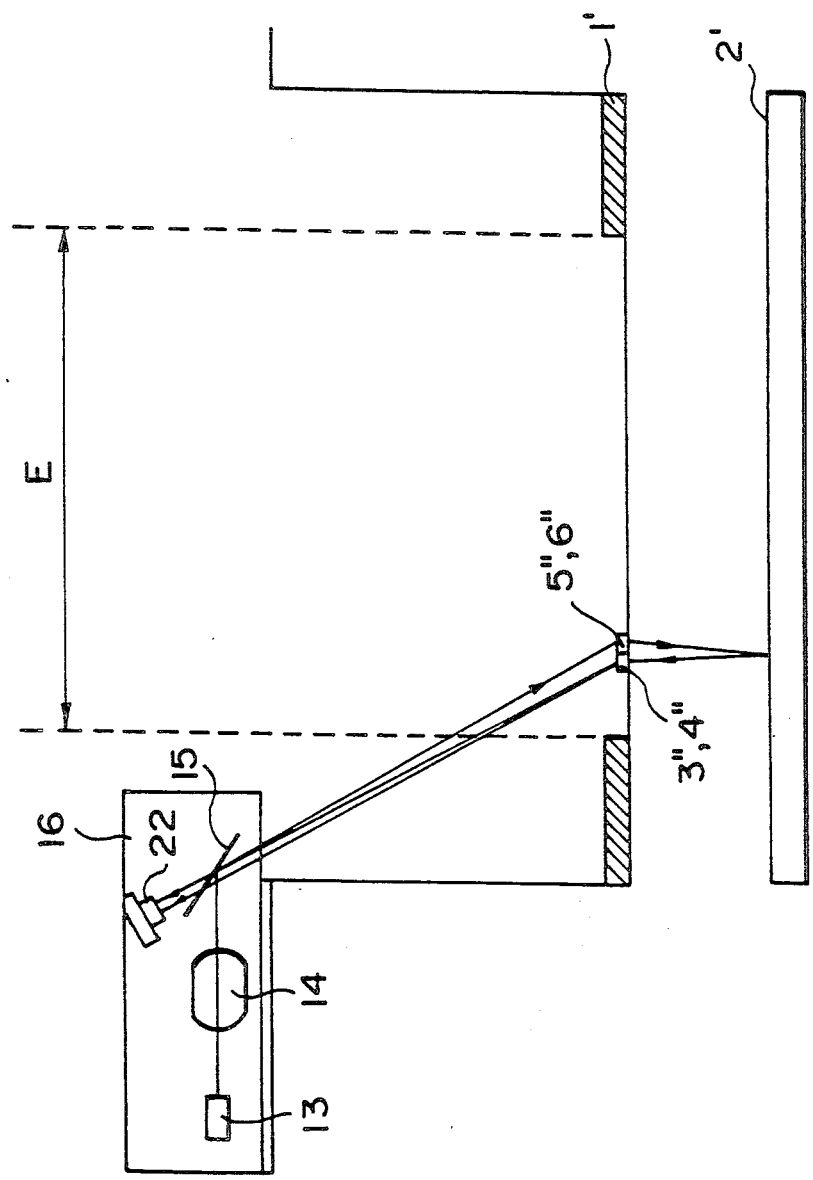
FIG. 5 is a schematic view, showing a modified form of the second embodiment.

The reference marks 5' and 6' or 3"-6" may be provided at a peripheral portion of a mask 1 which mask is to be used for actual transfer of a pattern. Alternatively, as illustrated in FIG. 5, these reference marks may be provided on a dummy mask 1' which is to be mounted to the apparatus only for the setting or calibration of the reference value or the deviation magnification. As a further alternative, these reference marks may be provided on a wafer or in a limited area on the wafer stage 17 or in an area adjacent thereto, at a site that can be irradiated with the light from the pickup 16.

In accordance with the present invention, as described hereinbefore, even if the setting precision of the sensor 22 is not very high, use of a reference mark or marks makes it possible to easily determine a reference value or a deviation magnification to be used for the actual positional deviation detection.

While the invention has been described with reference to the structures disclosed herein, it is not confined to the details set forth and this application is intended to cover such modifications or changes as may come within the purposes of the improvements or the scope of the following claims.

What is claimed is:

1. In a method of detecting relative positional deviation of first and second substrates, wherein first and second marks having optical powers are formed on the first substrate, wherein third and fourth marks having optical powers are formed on the second substrate, wherein a radiation beam is projected to the first substrate by an irradiating means, wherein as a result of the irradiation with the radiation beam the first and third marks produce a first beam whose position of incidence upon a predetermined plane is changeable in a first direction with the relative positional deviation of the first and second substrates, while the second and fourth marks produce a second beam whose position of incidence upon that plane is changeable in a second direction, different from the first direction, with the relative positional deviation of the first and second substrates, wherein a sensor disposed adjacent to the predetermined plane receives the first and second beams to produce an output signal corresponding to the spacing between the first and second beams upon the sensor, and wherein by using the output signal from the sensor the relative positional deviation of the first and second substrates is detected, the improvement comprising:

providing a reference mark adapted to produce, when irradiated with a radiation beam, third and fourth beams so that the third and fourth beams advance along respective light paths which are substantially coincident with the light paths for the first and second beams advancing to the sensor when the first and second substrates are in a predetermined positional relationship;

projecting, by use of the irradiating means, a radiation beam to the reference mark to thereby produce the third and fourth beams;

receiving, by use of the sensor, the produced third and fourth beams and producing, by use of the sensor, a reference signal corresponding to the spacing of the third and fourth beams upon the sensor; and detecting the relative position of the first and second substrates on the basis of the output signal and the reference signal.

2. A method according to claim 1, wherein the reference mark is provided on the first substrate.

3. A method according to claim 1, wherein the reference mark is provided on a stage for carrying thereon the firt substrate.

4. A method according to claim 1, wherein the reference mark is provided on a third substrate, different from the first and second substrates.

5. A method according to claim 1, wherein the reference mark is provided on the second substrate.

6. A method according to claim 1, wherein the third and fourth beams are provided by beams reflected by the reference mark.

7. A method according to claim 1, wherein the third and fourth beams are provided by beams transmitted through the reference mark.

8. A method according to claim 1, wherein the reference mark comprises a grating pattern.

9. A method according to claim 1, wherein the reference mark has an optical power.

10. A method according to claim 1, wherein the irradiating means comprises a semiconductor laser that produces the radiation beam.

11. A method according to claim 1, wherein the irradiating means comprises a light emitting diode that emits the radiation beam.

12. A method according to claim 1, wherein the irradiating means produces and directs a parallel beam to the first substrate and the reference mark, the parallel beam being the radiation beam.

13. A method according to claim 1, wherein the first substrate is a mask on which an integrated circuit pattern is formed and the second substrate is a semiconductor wafer.

14. A method according to claim 1, wherein the first substrate is a semiconductor wafer and the second substrate is a mask on which an integrated circuit pattern is formed.

15. A method according to claim 1, wherein the reference mark comprises a first reference pattern operable to produce the third beam and a second reference pattern different from the first reference pattern and being operable to produce the fourth beam.

16. A method according to claim 1, wherein the first and second substrates have surfaces opposed to each other and substantially parallel to each other, the first and second substrates being disposed with a predetermined interval maintained therebetween, wherein the irradiating means is disposed at a side of the first substrate remote from the second substrate, wherein the reference mark is provided between the irradiating means and a stage member for carrying thereon the second substrate, and wherein the third and fourth beams are formed by causing the beam from the reference mark irradiated with the radiation beam from the irradiating means to be reflected by a reflection mirror provided on the stage member and by causing the reflected beam to be inputted again to the reference mark.

17. A method according to claim 16, wherein the reference mark is provided on the first substrate.

18. A method according to claim 16, wherein the reference mark is provided on a third substrate, different from the first and second substrates.

19. A method according to claim 16, wherein the reference mark comprises a first reference pattern operable to deflect a portion of the radiation beam toward the reflection surface, a second reference pattern operable to deflect another portion of the radiation beam toward the reflection surface, a third reference pattern operable to deflect the beam deflected by the first reference pattern and reflected by the reflection surface, and a fourth reference pattern operable to deflect the beam deflected by the second reference pattern and reflected by the reflection surface.

20. A method according to claim 19, wherein each of the first, second, third and fourth reference patterns is provided by a grating pattern.

21. A method according to claim 1, wherein the first so fourth marks are set to that, when the first and second substrates have no relative positional deviation, the first and second beams are inputted to the sensor obliquely.

22. A method according to claim 21, wherein the reference mark includes a pattern operable to produce the third and fourth beams advancing along the same paths as of those of the first and second beams produced when the first and second substrates have no relative positional deviation.

23. A method according to claim 22, wherein, in said positional deviation detecting step, the positional deviation is detected on the basis of a difference between a spacing value represented by the reference signal and a spacing value represented by the output signal.

24. A method according to claim 1, wherein, in the positional deviation detecting step, a coefficient representing the quantity of change in one of the spacing of the first and second beams upon the sensor, corresponding to the positional deviation, and the proportion of the spacing value, is determined on the basis of the reference value and wherein the positional deviation is detected on the basis of the thus determined coefficient and the output signal.

25. A method according to claim 24, wherein the first to fourth marks are so set that, when the first and second substrates have no relative positional deviation, the first and second beams are inputted obliquely to the light receiving surface of the sensor.

26. A method according to claim 24, wherein the first to fourth marks are so set that, when the first and second substrates have no relative positional deviation, the first and second beams are inputted perpendicularly to the light receiving surface of the sensor.

27. A method according to claim 1, wherein the first to fourth marks are so set that the quantity of change in the spacing between the first and second beams upon the sensor is larger than the positional deviation of the first and second substrates.

28. A method according to claim 27, wherein the sensor is operable to detect the position of the center of gravity of each of first and second spots as formed on the light receiving surface of the sensor by the first and second beams, and to produce first and second signals corresponding to the gravity center positions, as the output signal.

29. A method according to claim 27, wherein the sensor is operable to detect a peak of an intensity distribution of each of first and second spots as formed on the light receiving surface of the sensor by the first and second beams, and to produce first and second signals corresponding to the peaks, as the output signal.

30. A method according to claim 27, wherein the sensor comprises a CCD array for photoelectrically converting the first and second beams, respectively.

31. A method according to claim 27, wherein the sensor comprises a position sensor for photoelectrically converting the first and second beams, respectively.

32. A method according to claim 27, wherein the first marked has a positive power, the second mark has a negative power, the third mark has a negative power, and the fourth mark has a positive power.

33. A method according to claim 27, wherein the irradiating means projects the radiation beam so that it is inputted obliquely to the surface of the first substrate.

34. A method according to claim 33, wherein the first and second marks are operable to deflect the radiation beam in a direction substantially perpendicular to the surface of the second substrate, and then to direct the radiation beam to the third and fourth marks.

35. A method according to claim 27, wherein a first substrate is a mask on which an integrated circuit pattern is formed, and the second substrate is a semiconductor wafer.

36. In a method of detecting relative positional deviation of first and second substrates, wherein first and second marks having optical powers are formed on the first and second substrates, respectively, wherein a radiation beam is projected to the first substrate by an irradiating means, wherein as a result of the irradiation with the radiation beam the first and second marks produce a signal beam whose position of incidence upon a predetermined plane is changeable with the relative positional deviation of the first and second substrates, wherein a sensor disposed adjacent to the predetermined plane receives the signalk beam to produce an output signal corresponding to the position of incidence of the signal beam upon the sensor, and wherein by using the output signal from the sensor the relative positional deviation of the first and second substrate is detected, the improvements comprising:

providing a reference mark adapted to produce, when irradiated with a radiation beam, a reference beam so that the reference beam advances along a light path which is substantially coincident with the light path for the signal beam advancing to the sensor when the first and second substrate are in a predetermined positional relationship;

projecting, by use of the irradiating means, a radiation beam to the reference mark to thereby produce the reference beam;

receiving, by use of the sensor, the produced reference beam and producing, by use of the sensor, a reference signal corresponding to the position of incidence of the reference beam upon the sensor; and detecting the relative position of the first and second substrates on the basis of the output signal and the reference signal.

37. A method according to claim 36, wherein the radiation beam comprises a plurality of light beams.

38. A method according to claim 36, wherein the reference beam comprises a plurality of beams.

* * * * *

UNITED STATES PATENT AND TRADEMARK OFFICE
CERTIFICATE OF CORRECTION

PATENT NO. : 5,114,235                                         Page 1 of 2
DATED : May 19, 1992
INVENTOR(S) : Shigeyuki Suda, et al.

It is certified that error appears in the above-identified patent and that said Letters Patent is hereby corrected as shown below:

ON THE Title PAGE, item [56]

UNDER U.S. PATENT DOCUMENTS

"4,327,805 4/1982 Feldman et al." should read --4,326,805 4/1982 Feldman et al.--.

COLUMN 4

Line 61, "madk 1" should read --mask 1--.

COLUMN 9

Line 33, "equall" should read --equal--.

COLUMN 10

Line 22, "60'" should read --6'--.

COLUMN 11

Line 1, "$\Delta D = D - D_o$" should read --$\Delta D \equiv D - D_o$--;
Line 53, "as" should read --at--; and
Line 54, "referenced" should read --reference--.

UNITED STATES PATENT AND TRADEMARK OFFICE
CERTIFICATE OF CORRECTION

PATENT NO. : 5,114,235
DATED : May 19, 1992
INVENTOR(S) : Shigeyuki Suda, et al.

It is certified that error appears in the above-identified patent and that said Letters Patent is hereby corrected as shown below:

COLUMN 15

Line 25, "so" should read --to-- and "to" should read --so--.

COLUMN 16

Line 15, "marked" should read --mark--;
Line 41, "signalk" should read --signal--; and
Line 46, "improvements" should read --improvement--.

Signed and Sealed this

Seventeenth Day of August, 1993

*Attest:*

BRUCE LEHMAN

*Attesting Officer*    *Commissioner of Patents and Trademarks*